(12) United States Patent
Katsura et al.

(10) Patent No.: US 9,980,331 B2
(45) Date of Patent: May 22, 2018

(54) OSCILLATION CIRCUIT

(71) Applicant: ROHM CO., LTD., Ukyo-ku, Kyoto (JP)

(72) Inventors: Koji Katsura, Kyoto (JP); Toru Takuma, Kyoto (JP); Yasunori Muramatsu, Kyoto (JP)

(73) Assignee: ROHM CO., LTD., Ukyo-Ku, Kyoto (JP)

( * ) Notice: Subject to any disclaimer, the term of this patent is extended or adjusted under 35 U.S.C. 154(b) by 0 days. days.

(21) Appl. No.: 15/219,618

(22) Filed: Jul. 26, 2016

(65) Prior Publication Data

US 2017/0041994 A1    Feb. 9, 2017

(30) Foreign Application Priority Data

Aug. 3, 2015 (JP) .................... 2015-153568

(51) Int. Cl.
| | | |
|---|---|---|
| *H05B 33/08* | (2006.01) | |
| *H03L 7/00* | (2006.01) | |
| *H03K 7/08* | (2006.01) | |
| *H03K 3/0233* | (2006.01) | |
| *H05B 37/02* | (2006.01) | |

(52) U.S. Cl.
CPC ..... *H05B 33/0815* (2013.01); *H03K 3/02337* (2013.01); *H03K 7/08* (2013.01); *H05B 33/0845* (2013.01); *H05B 33/0884* (2013.01); *H05B 37/0281* (2013.01)

(58) Field of Classification Search
CPC ............ H05B 33/0815; H05B 33/0845; H05B 37/0281; H03K 3/02337; H03K 7/08
See application file for complete search history.

(56) References Cited

U.S. PATENT DOCUMENTS

| | | | |
|---|---|---|---|
| 9,526,137 B1* | 12/2016 | Wang | H05B 33/0815 |
| 2010/0148732 A1* | 6/2010 | Lynch | H02J 7/345 320/166 |
| 2014/0203726 A1* | 7/2014 | Katsura | H05B 33/0815 315/291 |
| 2014/0354168 A1* | 12/2014 | Hyeon | H05B 37/02 315/209 R |
| 2015/0349639 A1* | 12/2015 | Hosoyama | H02M 3/158 323/271 |
| 2016/0191029 A1* | 6/2016 | Shuvalov | H03K 3/0231 327/291 |

FOREIGN PATENT DOCUMENTS

JP          2014143235 A          8/2014

* cited by examiner

*Primary Examiner* — Tung X Le
*Assistant Examiner* — Raymond R Chai
(74) *Attorney, Agent, or Firm* — Cantor Colburn LLP

(57) ABSTRACT

An oscillation circuit for generating a clock signal of a switching power supply circuit is provided. The oscillation circuit includes a circuit configured to perform frequency spreading control of the clock signal in synchronization with an output operation control signal for periodically turning on/off an output operation of the switching power supply circuit.

9 Claims, 18 Drawing Sheets

OSCILLATION CIRCUIT

CROSS-REFERENCE TO RELATED APPLICATION

This application is based upon and claims the benefit of priority from Japanese Patent Application No. 2015-153568, filed on Aug. 3, 2015, the entire contents of which are incorporated herein by reference.

TECHNICAL FIELD

The present disclosure relates to an oscillation circuit having a frequency spreading function (spread-spectrum function).

BACKGROUND

There has been conventionally proposed an oscillation circuit having a function of periodically changing an oscillation frequency of a clock signal so as to suppress a noise due to the clock signal (a so-called frequency spreading function).

However, for example, when this proposed oscillation circuit is used as a clock signal source of an emission driver with a pulse width modulation (PWM) dimming function, there are concerns that an output current supplied to a light source is greatly varied due to the influence of frequency spreading, which may result in a flicker.

SUMMARY

The present disclosure provides some embodiments of an oscillation circuit which is suitable to be used as a clock signal source of a switching power supply whose output operation is periodically turned on/off.

According to one embodiment of the present disclosure, there is provided an oscillation circuit for generating a clock signal of a switching power supply circuit. The oscillation circuit includes a circuit configured to perform frequency spreading control of the clock signal in synchronization with an output operation control signal for periodically turning on/off an output operation of the switching power supply circuit.

The oscillation circuit may include: a variable voltage generating unit configured to generate a variable voltage in synchronization with the output operation control signal; and a clock signal generating unit configured to determine an oscillation frequency of the clock signal based on the variable voltage.

The variable voltage generating part may sample/hold the variable voltage in synchronization with the output operation control signal.

The variable voltage generating part may include: a first current source configured to generate a charging current of a capacitor; a second current source configured to generate a discharging current of the capacitor; a hysteresis comparator configured to generate a comparison signal by comparing a charging voltage appearing on a first terminal of the capacitor with a threshold voltage; a charging/discharging control part configured to control charging/discharging of the capacitor in response to the comparison signal and the output operation control signal; and a switch which is connected between the first terminal of the capacitor and an output terminal of the variable voltage and is configured to be switched on/off in response to the output operation control signal.

The charging/discharging control part may bring one of the first current source and the second current source into an operation state in response to the comparison signal when the output operation of the switching power supply circuit is turned on, and bring both of the first current source and the second current source into a stop state, independent of the comparison signal, when the output operation of the switching power supply circuit is turned off.

The charging/discharging control part may bring one of the first current source and the second current source into an operation state in response to the comparison signal when the output operation control signal is not pulse-driven, and bring one of the first current source and the second current source into a stop state alternately each time the output operation of the switching power supply circuit is turned on, independent of the comparison signal, when the output operation control signal is pulse-driven.

The charging/discharging control part may include: a first logic part configured to bring one of the first current source and the second current source into an operation state in response to the comparison signal; a second logic part configured to bring one of the first current source and the second current source into an operation state alternately in synchronization with the output operation control signal; and a selector configured to select one of the first logic part and the second logic part.

The oscillation circuit may further include a detector configured to detect whether or not the output operation control signal is pulse-driven, and control the selector based on a result of the detection.

According to another embodiment of the present disclosure, there is provided a semiconductor device including: the above-described oscillation circuit configured to generate a clock signal; and a switching power supply circuit configured to be operated based on the clock signal.

According to another embodiment of the present disclosure, there is provided a lighting device including: the above-described semiconductor device; and a light source configured to emit light with power supplied from the semiconductor device.

DETAILED DESCRIPTION

Figure 1:
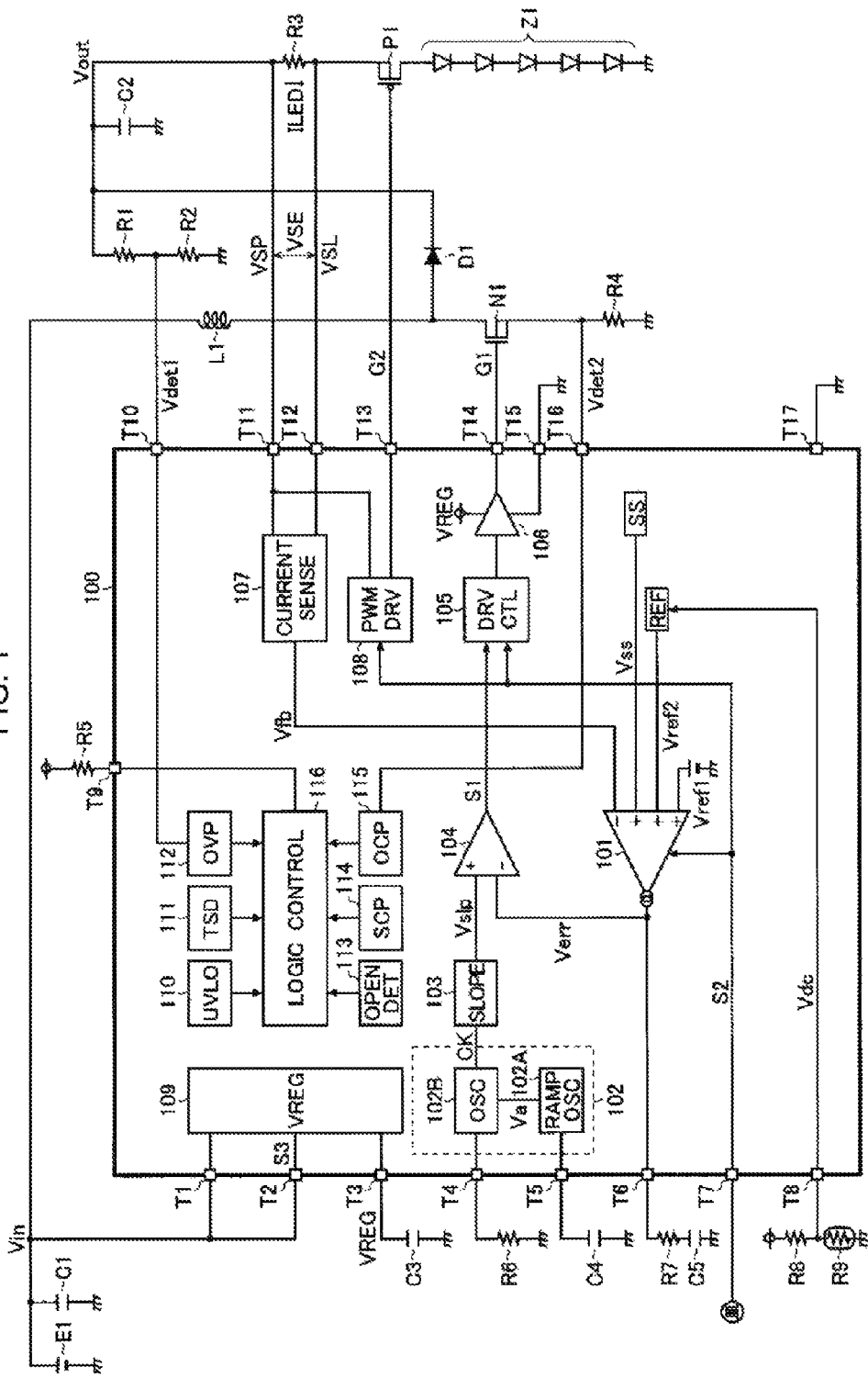
FIG. 1 is a block diagram showing one configuration example of a vehicle LED driver IC.

Some embodiments of the present disclosure will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

In the specification, the phrases "connection of a member A and a member B" and "a member A stacked on a member B" is intended to include direct physical connection of the member A and the member B as well as indirect connection thereof via other member as long as the other member has no substantial effect on the electrical connection of the member A and the member B or has no damage to functions and effects shown by a combination of the member A and the member B. Similarly, the phrase "interposition of a member C between a member A and a member B" is intended to include direct connection of the member A and the member C or direct connection of the member B and the member C as well as indirect connection thereof via other member as long as the other member has no substantial effect on the electrical connection of the member A, the member B and the member C or has no damage to functions and effects shown by a combination of the member A, the member B and the member C.

<Vehicle LED Driver IC>

FIG. 1 is a block diagram showing one configuration example of a vehicle LED driver IC 100. In this configuration example, the vehicle LED driver IC 100 (hereinafter referred to as an "IC 100") is implemented with a silicon monolithic semiconductor integrated circuit device in which an error amplifier 101, an oscillation circuit 102, a slope voltage generating part 103, a comparator 104, a driver control part 105, a driver 106, a current sensing part 107, a PWM driving part 108, a reference voltage generating part 109, an undervoltage detecting part 110, a temperature abnormality detecting part 111, an overvoltage detecting part 112, an LED open detecting part 113, an LED short detecting part 114, an overcurrent detecting part 115 and a logic control part 116 are integrated.

The IC 100 includes external terminals T1 to T17 as means for establishing electrical connections with an outside. In a vehicle application (LED lighting device) illustrated in FIG. 1, the IC 100 is externally connected with a battery E1, a light emitting diode array (load) Z1, resistors R1 to R8, a negative temperature coefficient thermistor R9. capacitors C1 to C5, a coil L1, a diode D1 an N-channel MOS (Metal Oxide Semiconductor) field effect transistor N1 and a P-channel MOS field effect transistor P1.

A positive terminal of the battery E1 is connected to the external terminal T1 (VCC pin) and the external terminal T2 (EN pin). A negative terminal of the battery E1 is connected to a ground terminal. A first terminal of the capacitor C1 is connected to the external terminal T1. A second terminal of the capacitor C1 is connected to the ground terminal. A first terminal of the capacitor C3 is connected to the external terminal T3 (VREG terminal). A second terminal of the capacitor C3 is connected to the ground terminal. A first terminal of the resistor R6 is connected to the external terminal T4 (RT pin). A second terminal of the resistor R6 is connected to the ground terminal. A first terminal of the capacitor C4 is connected to the external terminal T5 (RS pin). A second terminal of the capacitor C4 is connected to the ground terminal. A first terminal of the resistor R7 is connected to the external terminal T6 (COMP pin). A second terminal of the resistor R7 is connected to a first terminal of the capacitor C5. A second terminal of the capacitor C5 is connected to the ground terminal. The external terminal T7 (PWM pin) is connected to a terminal for applying a PWM dimming signal. A first terminal of the resistor R8 is connected to a terminal for applying a reference voltage VREG. A second terminal of the resistor R8 and a first terminal of the negative temperature coefficient thermistor R9 are both connected to the external terminal T8 (DC pin). A second terminal of the negative temperature coefficient thermistor R9 is connected to the ground terminal. A first terminal of the resistor R5 is connected to the terminal for applying the reference voltage VREG. A second terminal of the resistor R5 is connected to the external terminal T9 (FAIL pin).

A first terminal of the coil L1 is connected to the positive terminal of the battery E1. A second terminal of the coil L1 is connected to a drain of the transistor N1 and an anode of the diode D1. A gate of the transistor N1 is connected to the external terminal T14 (SWOUT pin). A source and a back gate of the transistor N1 are connected to a first terminal of the resistor R4 and the external terminal T16 (CS pin). A second terminal of the resistor R4 is connected to the ground terminal. A cathode of the diode D1 is connected to a first terminal of the resistor R1, a first terminal of the capacitor C2 and a first terminal of the resistor R3. A second terminal of the resistor R1 and a first terminal of the resistor R2 are both connected to the external terminal T10 (ODT pin). A second terminal of the resistor R2 is connected to the ground terminal. A second terminal of the capacitor C2 is connected to the ground terminal. The first terminal of the resistor R3 is connected to the external terminal T11 (SP pin). A second terminal of the resistor R3 is connected to the external terminal T12 (SL pin). A source and a back gate of the transistor P1 are connected to the second terminal of the resistor R3. A gate of the transistor P1 is connected to the external terminal T13 (PWMG pin). A drain of the transistor P1 is connected to an anode of the light emitting diode array Z1. A cathode of the light emitting diode Z1 is connected to the ground terminal. The external terminal T15 (DGND pin) and the external terminal T17 (GND pin) are both connected to the ground terminal.

Subsequently, an outline of each of the circuit blocks integrated into the IC 100 will be described.

The error amplifier 101 generates an error voltage Verr to the external terminal T6 by generating a charging/discharging current of the capacitor C5 based on a difference between the lowest one of a reference voltage Vref1, a reference voltage Vref2 and a soft-start voltage Vss, which are applied respectively to three non-inverting (+) input terminals, and a feedback voltage Vfb, which is applied to an inverting (−) input terminal.

After an input voltage Vin is input to the IC 100, the soft-start voltage Vss rises more gradually than the reference voltage Vref1 and finally rises to a voltage higher than the reference voltage Vref1. Accordingly, when the IC 100 is powered up, an output feedback control (soft-start control) is performed to match the feedback voltage Vfb with the soft-start voltage Vss, thereby preventing an inrush current from flowing into the capacitor C2 and the light emitting diode array Z1.

The reference voltage Vref2 is varied depending on a terminal voltage Vdc of the external terminal T8. Therefore, the external terminal T8 can be used to linearly control an output current ILED flowing to the light emitting diode array Z1 based on the terminal voltage Vdc. The external terminal T8 is mainly used for derating. Specifically, the external terminal T8 is used to suppress the light emitting diode array Z1 from deteriorating at a high temperature and suppress an overcurrent from flowing into external components under conditions where a supply voltage likely fluctuates (such as when an idling stop function is implemented).

An output operation of the error amplifier 101 is enabled/disable in response to a PWM dimming signal S2 input through the external terminal T7. To be specific, the output operation of the error amplifier 101 is enabled when the PWM dimming signal S2 has a high level, while being disabled when the PWM dimming signal S2 has a low level.

The oscillation circuit 102 includes a ramp voltage generating part 102A to generate a ramp voltage Va and a clock signal generating part 102B to generate a clock signal CK. A configuration and operation of the oscillation circuit 102 will be described later in more detail.

The slope voltage generating part 103 generates a sawtooth or triangular slope voltage Vslp using the clock signal CK.

The comparator 104 compares the error signal Verr applied to an inverting (−) input terminal with the slope voltage Vslp applied to a non-inverting (+) input terminal, and generates a comparison signal S1.

The driver control part 105 controls turning-on/off of the transistor N1 by driving the driver 106 based on the comparison signal S1. An output operation of the driver control part 105 is enabled/disabled based on the PWM dimming signal S2. To be specific, the output operation of the driver control part 105 is enabled when the PWM dimming signal S2 has a high level, while being disabled when the PWM dimming signal S2 has a low level.

The driver 106 generates a gate signal G1 (high level: VREG, low level: DGND) of the transistor N1 in response to an instruction from the driver control part 105 and outputs it to the external terminal T14.

The current sensing part 107 monitors a voltage (a sense voltage VSE (=VSP−VSL) varied depending on the output current ILED) applied between the external terminal T11 and the external terminal T12, and generates the feedback voltage Vfb based on the monitored voltage.

The PWM driving part 108 generates a gate signal G2 of the transistor P1 based on the PWM dimming signal S2. To be specific, the PWM driving part 108 sets the gate signal G2 to a low level when the PWM dimming signal S2 has a high level, while setting the gate signal G2 to a high level when the PWM dimming signal S2 has a low level. Accordingly, by inputting the PWM dimming signal S2 to the external terminal T7, the output current ILED can be controlled in a time division manner and brightness can be linearly controlled.

The reference voltage generating part 109 generates the reference voltage VREF (for example, 5V) in response to the input voltage Vin (for example, 5V to 60V) applied to the external terminal T1, and outputs the reference voltage VREF to the external terminal T3. In addition, an output operation of the reference voltage generating part 109 is enabled/disabled based on an enable signal S3 input through the external terminal T2. To be specific, the output operation of the reference voltage generating part 109 is enabled when the enable signal S3 has a high level, while being disabled when the enable signal S3 has a low level.

The undervoltage detecting part 110 detects an undervoltage by monitoring the reference voltage VREG. For example, if a detected voltage decreases such that VREG≤4.3V, all circuit blocks except for the reference voltage generating part 109 are shut down. On the other hand, when VREG≥4.3V, the shut-down is released.

The temperature abnormality detecting part 111 detects temperature abnormality by monitoring a junction temperature (Tj) of the IC 100. For example, if the temperature abnormality is detected as Tj≥175 degrees C, all circuit blocks except the reference voltage generating part 109 are shut down. On the other hand, if Tj≤150 degrees C, the shut-down is released.

The overvoltage detecting part 112 detects an overvoltage by monitoring a terminal voltage Vdet1 (=a voltage divided from an output voltage Vout) of the external terminal T10.

The LED open detecting part 113 detects LED open by monitoring the sense voltage VSE as well as a result of the detection by the overvoltage detecting part 112. For example, if VSE≤50 mV and Vdet1≥2V, LED open is detected and all circuit blocks except for the reference voltage generating part 109 are shut down. On the other hand, when the enable signal S3 is again input, the shut-down is released.

The LED short detecting part 114 detects an LED short by monitoring the terminal voltage VSL of the external terminal T12 and the sense voltage VSE. For example, if VSL≤2V or VSE≥0.3V, an LED short is detected and the soft-start voltage Vss is discharged to stop DC/DC switching. On the other hand, if VSL>2V or VSE<0.3V, the soft-start voltage Vss begins to be recharged to restart the DC/DC switching.

The overcurrent detecting part 115 detects an overcurrent by monitoring a terminal voltage (a voltage signal depending on a current flowing through the transistor N1) of the external terminal T16. For example, if Vdet2≥0.4V, an overcurrent is detected and the soft-start voltage Vss is discharged to stop DC/DC switching. On the other hand, if Vdet2<0.4V, the soft-start voltage Vss begins to be recharged to restart the DC/DC switching.

The logic control part 116 performs the above-mentioned shut-down control based on results of the detection by the undervoltage detecting part 110, the temperature abnormality detecting part 111, the overvoltage detecting part 112, the LED open detecting part 113, the LED short detecting part 114 and the overcurrent detecting part 115 and, at the same time, performs an open drain output control of a protection flag signal FAIL using the external terminal T9.

Among the above components, the error amplifier 101, the oscillation circuit 102, the slope voltage generating part 103, the comparator 104, the driver control part 105, the driver 106, the current sensing part 107, the PWM driving part 108 and a group of discrete parts (the transistor N1, the coil L1, the diode D1, the resistors R1 to R4 and the capacitor C2) forming an output stage correspond to a switching power supply circuit which uses the clock signal CK generated in the oscillation circuit 102 to generate an output voltage Vout from an input voltage Vin and supplies the output voltage Vout to the light emitting diode array Z1 (light source).

Although FIG. 1 illustrates a step-up output stage of the switching power supply circuit, the output stage is not limited thereto but may cope with step-down, step-down/step-up and SEPIC types.

<First Configuration Example of Oscillation Circuit>

Figure 2:
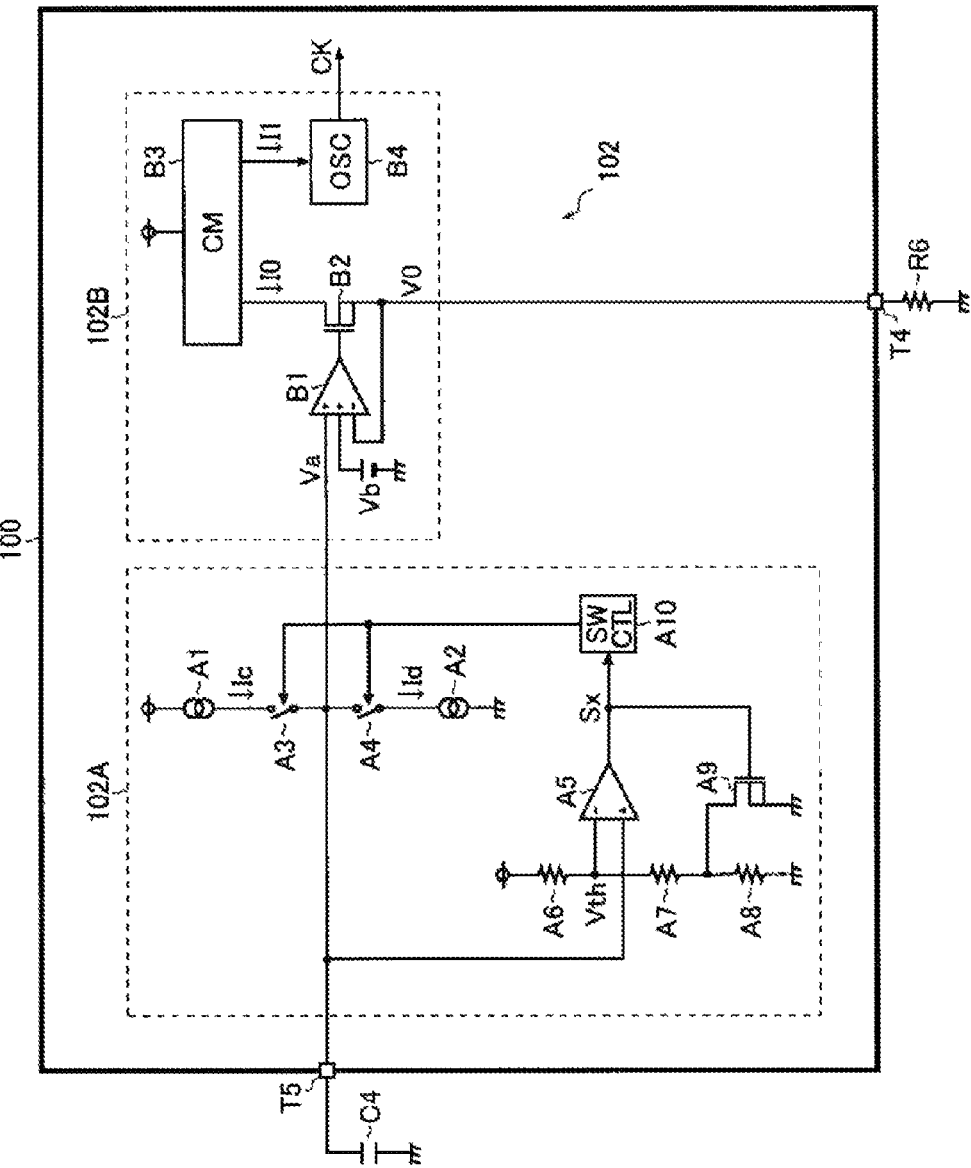
FIG. 2 is a circuit diagram showing a first configuration example of an oscillation circuit.

FIG. 2 is a circuit diagram showing a first configuration example of the oscillation circuit 102. In the oscillation circuit 102 of the first configuration example, the ramp voltage generating part 102A includes current sources A1 and A2, switches A3 and A4, a comparator A5, resistors A6 to A8, an N channel MOS field effect transistor A9 and a switch control part A10, and outputs a voltage (charging voltage) between both ends of the capacitor C4 externally attached to the external terminal T5 as the ramp voltage Va.

The current sources A1 and A2 generate a charging current Ic and a discharging current Id of the capacitor C4, respectively. The switches A3 and A4 conduct/interrupt current flows of the charging current Ic and the discharging current Id in response to an instruction from the switch control part A10, respectively. To explain a connection relationship in detail, a first terminal of the current source A1 is connected to an application terminal for the reference voltage VREG. A second terminal of the current source A1 is connected to the external terminal T5 via the switch A3. A first terminal of the current source A2 is connected to the external terminal T5 via the switch A4. A second terminal of the current source A2 is connected to a ground terminal.

The comparator A5, the resistors A6 to A8 and the transistor A9 form a hysteresis comparator to generate a comparison signal Sx by comparing the ramp voltage Va with a threshold voltage Vth (VthH/VthL). To explain a connection relationship in detail, a non-inverting (+) input terminal of the comparator A5 is connected to the external terminal T5. A first terminal of the resistor A6 is connected to an application terminal for the reference voltage VREG. A connection node between a second terminal of the resistor A6 and a first terminal of the resistor A7 is connected, as an application terminal for the threshold voltage Vth (VthH/VthL), to an inverting input terminal (−) input terminal of the comparator A5. A second terminal of the resistor A7 is connected to a first terminal of the resistor A8 and a drain of the transistor A9. A second terminal of the resistor A8 and a source and a back gate of the transistor A9 are all connected to the ground terminal. A gate of the transistor A9 is connected to an output terminal of the comparator (application terminal for the comparison signal Sx).

The switch control part A10 corresponds to a charging/discharging control part which switches between charging and discharging of the capacitor C4 by performing a switching on/off control for the switches A3 and A4 based on the comparison signal Sx.

In the oscillation circuit 102 of the first configuration example, the clock signal generating part 102B includes an operational amplifier B1, an N channel MOS field effect transistor B2, a current mirror B3 and an oscillator B4, and generates a clock signal CK having an oscillation frequency Fosc based on a ramp signal Va.

The operational amplifier B1 and the transistor B2 form a bias part to apply a lower one of the ramp voltage Va and a fixed voltage Vb, as a bias voltage V0, to the resistor R6. To explain a connection relationship in detail, a first non-inverting (+) input terminal of the operational amplifier B1 is connected to an application terminal of the ramp voltage Va. A second non-inverting (+) input terminal of the operational amplifier B1 is connected to an application terminal of the fixed voltage Vb. An inverting (−) input terminal of the operational amplifier B1 is connected to the external terminal T4. An output terminal of the operational amplifier B1 is connected to a gate of the transistor B2. A drain of the transistor B2 is connected to an input terminal of the current mirror B3. A source and a back gate of the transistor B2 are both connected to the external terminal T4.

The current mirror B3 generates a mirror current I1 by mirroring a bias current I0 (=V0/R6) flowing through the resistor R6.

The oscillator B4 determines the oscillation frequency Fosc of the clock signal CK by adjusting a charging/discharging current for an internal capacitor (not shown) based on the mirror current I1 (further the bias current I0).

Figure 3:
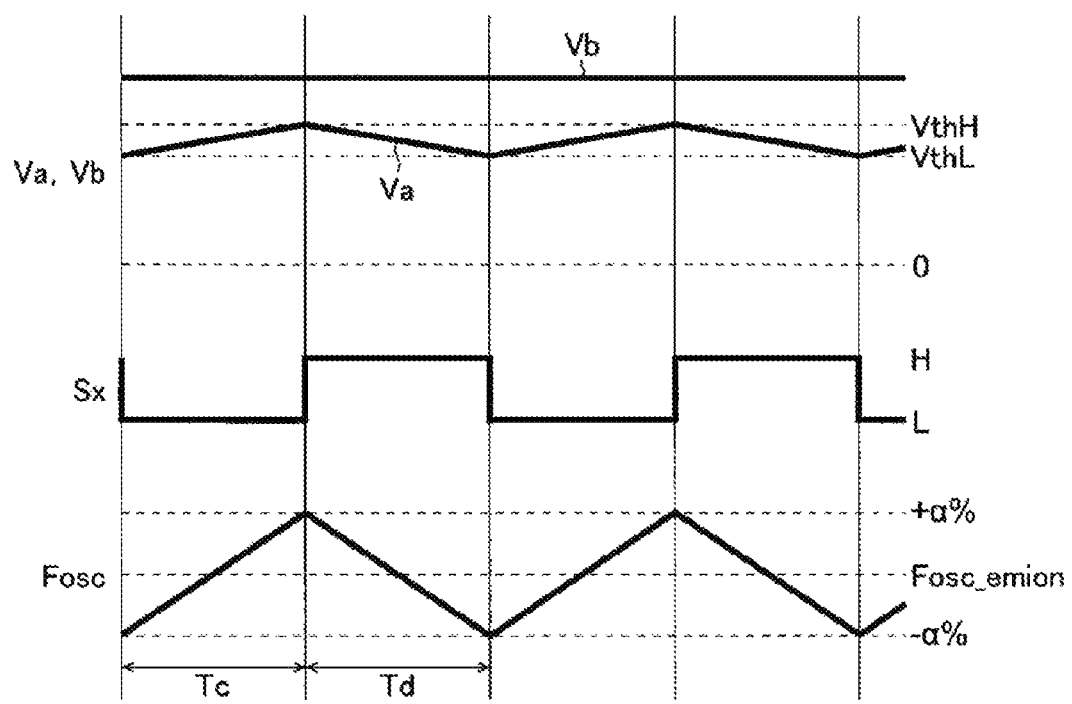
FIG. 3 is a timing chart showing one example of a frequency spreading operation.

Next, a frequency spreading operation of the oscillation circuit 102 as configured above will be described in detail with reference to FIG. 3. FIG. 3 is a timing chart showing one example of frequency spreading operation, showing the ramp voltage Va, the fixed voltage Vb, the comparison signal Sx and the oscillation frequency Fosc from top to bottom.

When the comparison signal Sx has a low level, the transistor A9 is turned off, and an upper threshold voltage VthH (for example, 0.9V) is generated as the threshold voltage Vth. When the comparison signal Sx has the low level, the switch control part A10 switches on the switch A3 and switches off the switch A4. Accordingly, in a low level period Tc of the comparison signal Sx, the capacitor C4 is charged by the charging current Ic and the ramp voltage Va rises accordingly.

When the ramp voltage Va becomes higher than the upper threshold voltage VthH (high level) during the charging of the capacitor C4, the comparison signal Sx rises from a low level to a high level. At this time, since the transistor A9 is turned on, the threshold voltage Vth is lowered from the upper threshold voltage VthH to a lower threshold voltage VthL (for example, 0.7V). Accordingly, the comparison signal Sx is maintained at a high level until the ramp voltage Va falls below the lower threshold voltage VthL. On the other hand, when the comparison signal Sx has a high level, the switch control part A10 switches off the switch A3 and switches on the switch A4. Accordingly, in a high level period Td of the comparison signal Sx, the capacitor C4 is discharged by the discharging current Id and the ramp voltage Va falls accordingly.

When the ramp voltage Va becomes lower than the lower threshold voltage VthL (low level) during the discharging of the capacitor C4, the comparison signal Sx falls from a high level to a low level and the threshold voltage Vth rises from the lower threshold voltage VthL to the upper threshold voltage VthH again. Accordingly, the comparison signal Sx is maintained at a low level until the ramp voltage Va exceeds the upper threshold voltage VthH.

The same operation is repeated thereafter, and a periodically varying triangular ramp voltage Va with an average (for example, 0.8V) of the upper threshold voltage VthH and the lower threshold voltage VthL as a center value is generated.

The operational amplifier B1 controls the gate of the transistor B2 such that a lower one of the ramp voltage Va and the fixed voltage Vb is equal to the bias voltage V0. For example, assuming that 0.7V≤Va≤0.9V and Vb=1.2V, a lower ramp voltage Va is applied, as the bias voltage V0, to the resistor R6. Accordingly, the bias current I0 flowing through the resistor R6 is periodically varied depending on the ramp voltage Va.

As described earlier, the oscillator B4 determines the oscillation frequency Fosc of the clock signal CK based on the bias current I0. Accordingly, the oscillation frequency Fosc of the clock signal CK is periodically varied depending on the ramp voltage Va.

When a frequency spreading function (low EMI (Electro Magnetic Interference) function) is enabled, a center value Fosc_emion of the oscillation frequency Fosc is determined based on the center value (=(VthH+VthL)/2) of the ramp voltage Va and resistance of the resistor R6. Further, a modulation degree (±α %) of the oscillation frequency Fosc is determined based on the uppermost and lowermost limits of the ramp voltage Va and the resistance of the resistor R6.

On the other hand, when the frequency spreading function is disabled, the external terminal T5 and the external terminal T3 may be shorted to pull-up the ramp voltage Va to the reference voltage VREG (for example, 5V) higher than the fixed voltage Vb (for example, 1.2V). Such connection allows the clock signal CK to be fixed to an oscillation frequency Fosc_emioff in response to the fixed voltage Vb. At this time, since the comparison signal Sx is at a high level at all times and thus the switch control part A10 remains switched on at all times, the discharging current Id continues to flow. However, if the discharging current Id is designed to have a sufficiently small value (for example, μA order), the current consumption may be ignored.

With the configuration having the external terminal T4 for externally connecting the resistor R6, it is possible to arbitrarily set the oscillation frequency Fosc (_emion/_emioff) of the clock signal CK by adjusting the resistance of the resistor R6.

However, since there is a difference between the center value of the ramp voltage Va and the fixed voltage Vb, there is a need to change the resistance of the resistor R6 depending on ON/OFF of the frequency spreading function in order to adjust the oscillation frequency Fosc of the clock signal CK to a desired value. For example, assuming that the center value of the ramp voltage Va is 0.8V and the fixed voltage Vb is 1.2V, the resistance of the resistor R6 when the frequency spreading function is enabled may be set to ⅔ (=0.8V/1.2V) of that when the frequency spreading function is disabled.

The low level period Tc (charging time of the capacitor C4) and high level period Td (discharging time of the capacitor C4) of the comparison signal Sx are calculated according to the following equations 1a and 1b, respectively.

$$Tc=C4\times\Delta V/Ic \quad (1a)$$

$$Td=C4\times\Delta V/Id \quad (1b)$$

Where, ΔV=VthH−VthL

Accordingly, assuming that Ic=Id=IRS, an oscillation frequency Framp (=1/(Tc+Td)) of the ramp voltage Va is calculated according to the following equation 2.

$$Framp=IRS/(2\times C4\times\Delta V) \quad (2)$$

With the configuration having the external terminal T5 for externally connecting the capacitor C4, the oscillation frequency Framp of the ramp voltage Va (further a variable frequency obtained when the oscillation frequency Fosc of the clock signal CK is varied periodically) can be set arbitrarily by adjusting the capacitance of the capacitor C4.

Figure 4:
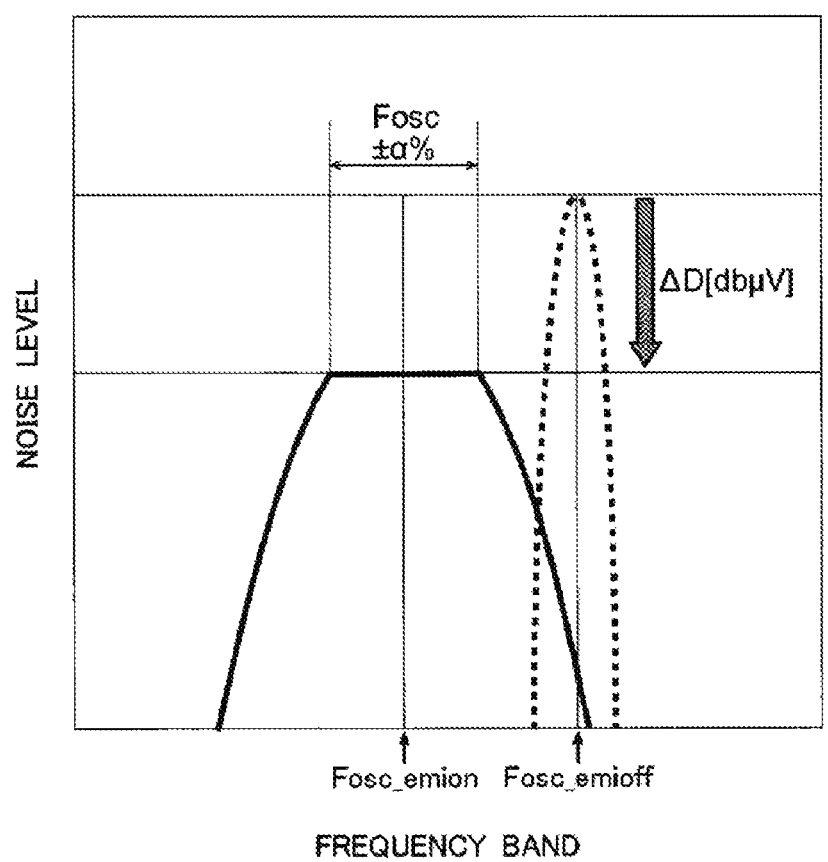
FIG. 4 is a view showing one example of noise reduction by the frequency spreading operation.

FIG. 4 is a view showing one example of noise reduction by the frequency spread operation. In this figure, the vertical axis represents a noise level and the horizontal axis represents a frequency band. In the figure, a solid line represents a noise spectrum obtained when the frequency spreading function is enabled, and a dashed line represents a noise spectrum obtained when the frequency spreading function is disabled.

As shown in the figure, the noise spectrum becomes a narrow spectrum having a larger peak value when the frequency spreading function is disabled, whereas it becomes a wide spectrum having a smaller peak value when the frequency spreading function is enabled. Although FIG. 4 depicts only a fundamental wave, the peak value of the spectrum for harmonics can be also greatly reduced when the frequency spreading function is enabled. A theoretical attenuation ΔD[dBμV] can be calculated according to the following equation 3.

$$\Delta D=10\times\log(4/(Fosc\_emion\times C4\times R6)) \quad (3)$$

Thus, the oscillation circuit 102 having the frequency spreading function can be used to suppress noise caused by the clock signal CK, which can result in reducing the number of external components for EMI countermeasure, set compactness and cost reduction.

The oscillation circuit 102 of the first configuration example can realize the frequency spreading function more simply than a conventional configuration, thereby reducing variations of the oscillation frequency Fosc and achieving set compactness and reduction in costs.

<Second Configuration Example of Oscillation Circuit>

Figure 5:
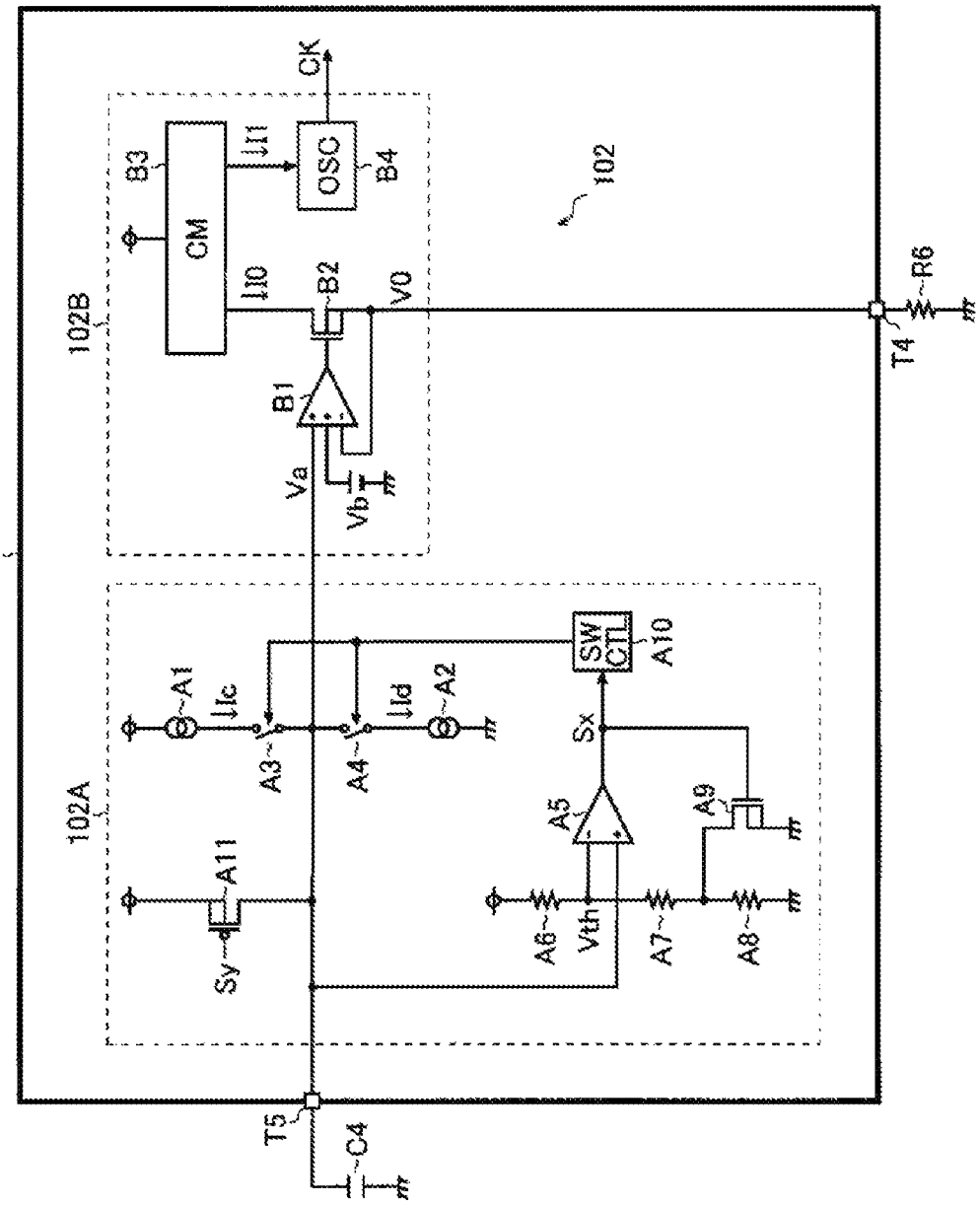
FIG. 5 is a circuit diagram showing a second configuration example of the oscillation circuit.

FIG. 5 is a circuit diagram showing an oscillation circuit 102 of a second configuration example. The oscillation circuit 102 of the second configuration example has basically the same configuration as that of the first configuration example except that a ramp voltage generating part 102A includes a P channel MOS field effect transistor A11. Therefore, the same elements as the first configuration example are denoted by the same reference numerals as FIG. 2, an explanation of which will not be repeated. The following description will be focused on characteristic portions of the second configuration example.

The transistor A11 corresponds to a pull-up part to pull up the ramp voltage Va over the fixed voltage Vb at the start of the oscillation circuit 102. To explain a connection relationship in detail, a source and a back gate of the transistor A11 are connected to an application terminal for the reference voltage VREG. A drain of the transistor A11 is connected to the external terminal T5. A gate of the transistor A11 is connected to an application terminal of a start detection signal Sy. The start detection signal Sy is a binary signal generated, for example, by comparing the soft-start voltage Vss with a predetermined threshold voltage VTH.

Figure 6:
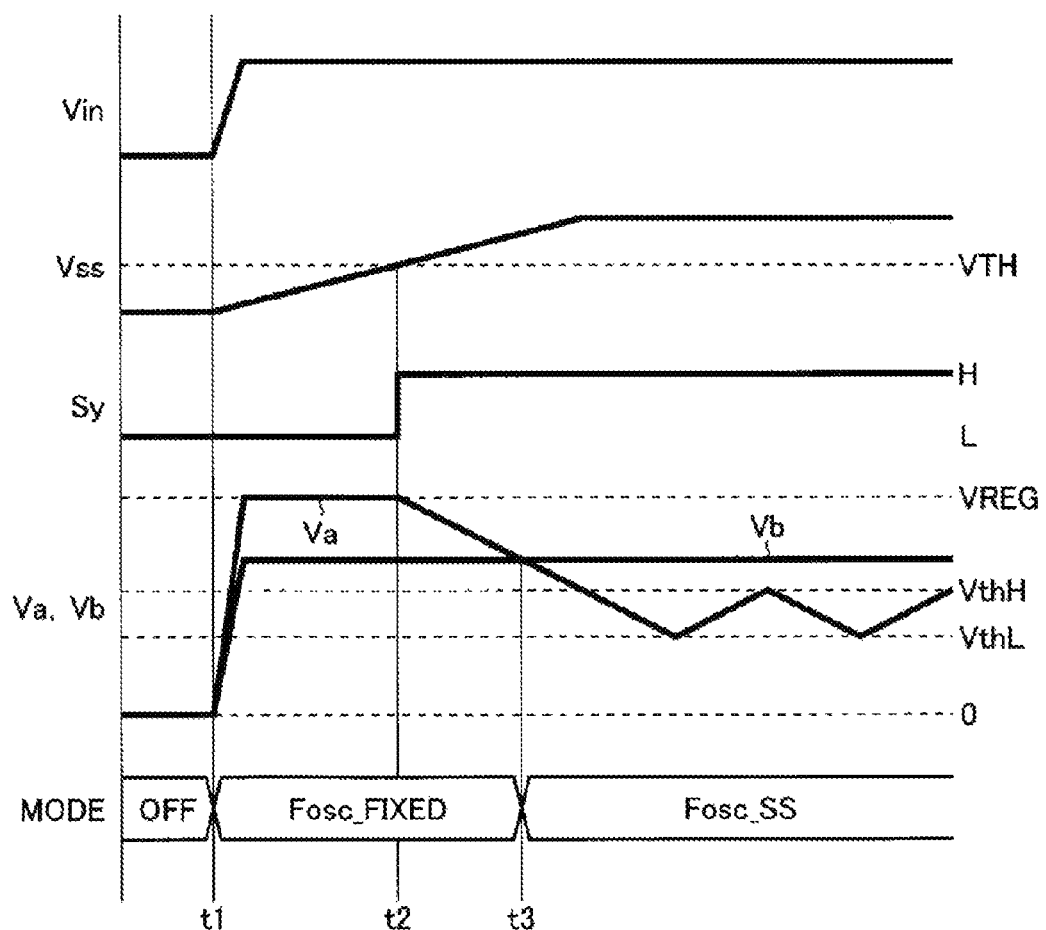
FIG. 6 is a timing chart showing one example of mode switching in startup.

FIG. 6 is a timing chart showing one example of mode switching in the start of the oscillation circuit 102, showing the input voltage Vin, the soft-start voltage Vss, the start detection signal Sy, the ramp voltage Va, the fixed voltage Vb and the operation mode of the oscillation circuit 102 from top to bottom.

At time t1, when the input voltage Vin is input, the soft-start voltage Vss begins to rise smoothly. However, at this point of time, since the soft-start voltage Vss is lower than the threshold voltage VTH, the start detection signal Sy remains at a low level. As a result, since the transistor A11 is turned on and the ramp voltage Va is pulled up to the reference voltage VREG higher than the fixed voltage Vb, the frequency spreading function is disabled and the clock signal CK is fixed to the oscillation frequency Fosc depending on the fixed voltage Vb. In addition, when the transistor A11 is turned on, since the comparison signal Sx remains at a high level at all times, like when the external terminal T5 is shorted to the external terminal T3, the discharging current Id continues to flow. However, if the discharging current Id is designed to have a sufficiently small value (for example, μA order), the current consumption may be ignored.

With the soft-start voltage continuing to rise, at time t2, when the soft-start voltage Vss becomes higher than the threshold voltage VTH, the start detection signal Sy rises to a high level. As a result, the transistor A11 is turned off and the ramp voltage Va is gradually decreased with the discharging of the capacitor C4. However, during a period in which the ramp voltage Va is higher than the fixed voltage Vb, the frequency spreading function remains disabled.

Thereafter, as the capacitor C4 proceeds to be discharged, at time t3 when the ramp voltage Va becomes lower than the fixed voltage Vb, the frequency spreading function is activated and the oscillation frequency Fosc of the clock signal CK is periodically varied depending on the ramp voltage Va.

Thus, by employing a sequence of disabling the frequency spreading function at the start of the oscillation circuit 102_2 and then enabling the frequency spreading function from the time when a predetermined period has elapsed, a high impedance state (an undefined logical state of the comparison signal Sx) of the external terminal T5 can be promptly eliminated al the start of the oscillation circuit 102_2, thereby preventing poor start of the oscillation circuit 102_2.

<Third Configuration Example of Oscillation Circuit>

Figure 7:
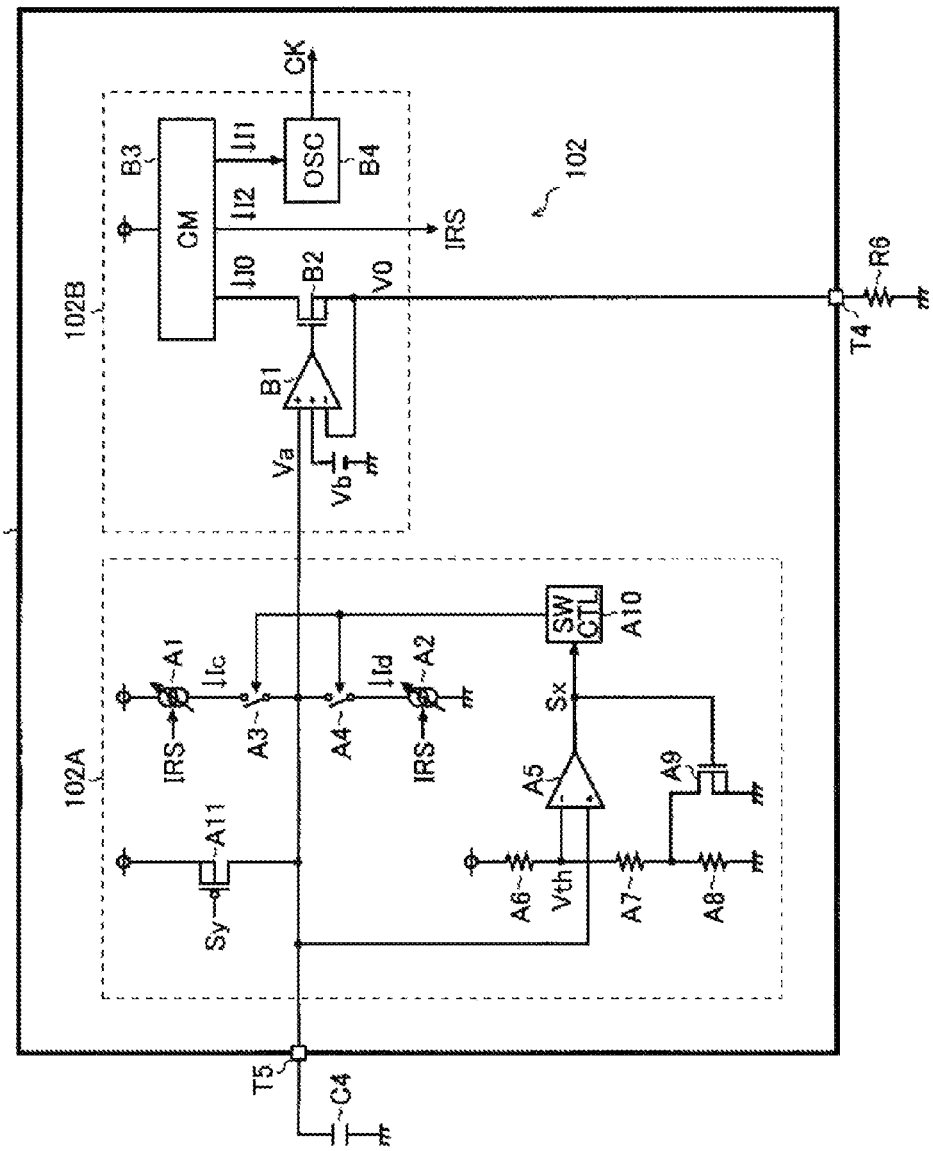
FIG. 7 is a circuit diagram showing a third configuration example of the oscillation circuit.

FIG. 7 is a circuit diagram showing an oscillation circuit 102 of a third configuration example. The oscillation circuit 102 of the third configuration example has basically the same configuration as those of the first and second configuration examples except that the current sources A1 and A2 determine values of the charging current Ic and the discharging current Id depending on the bias current I0. Therefore, the same elements as the first and second configuration examples are denoted by the same reference numerals as FIGS. 2 to 5, an explanation of which will not be repeated. The following description will be focused on characteristic portions of the third configuration example.

In the oscillation circuit 102 of the third configuration example, the current mirror B3 generates the mirror current I1 to be supplied to the oscillator B4 by mirroring the bias current I0 and, at the same time, generates a mirror current I2 (current value: IRS) to be supplied to the current sources A1 and A2. The current sources A1 and A2 output the mirror current I2 as the charging current Ic and the discharging current Id, respectively.

With this configuration, when the resistance of the resistor R6 is determined by a user in order to set the oscillation frequency Fosc of the clock signal CK, a value of the bias current I0 is accordingly determined and the charging current Ic and the discharging current Id are determined as well.

For example, the smaller resistance of the resistor R6 provides a larger value of the bias current I0 and a higher oscillation frequency Fosc of the clock signal CK. In this case, the charging current Ic and the discharging current Id are also increased and, accordingly, the oscillation frequency Framp of the ramp voltage Va becomes higher depending on the oscillation frequency Fosc of the clock signal CK.

On the contrary, the larger resistance of the resistor R6 provides a smaller value of the bias current I0 and a lower oscillation frequency Fosc of the clock signal CK. In this case, the charging current Ic and the discharging current Id are also decreased and, accordingly, the oscillation frequency Framp of the ramp voltage Va becomes lower depending on the oscillation frequency Fosc of the clock signal CK.

For example, Framp=300 Hz for Fosc=300 kHz, and Framp=900 Hz for Fosc=900 kHz.

Thus, with the oscillation circuit 102 of the third configuration example, the oscillation frequency Fosc of the clock signal CK and the oscillation frequency Framp of the ramp voltage Va (further a variable frequency obtained when the oscillation frequency Fosc of the clock signal CK is varied periodically) can be changed in association with each other. Accordingly, it is not required to adjust the capacitance of the capacitor C4 whenever the resistance of the resistor R6 is adjusted, which can result in improved usability.

<Study on Flicker>

Figure 8:
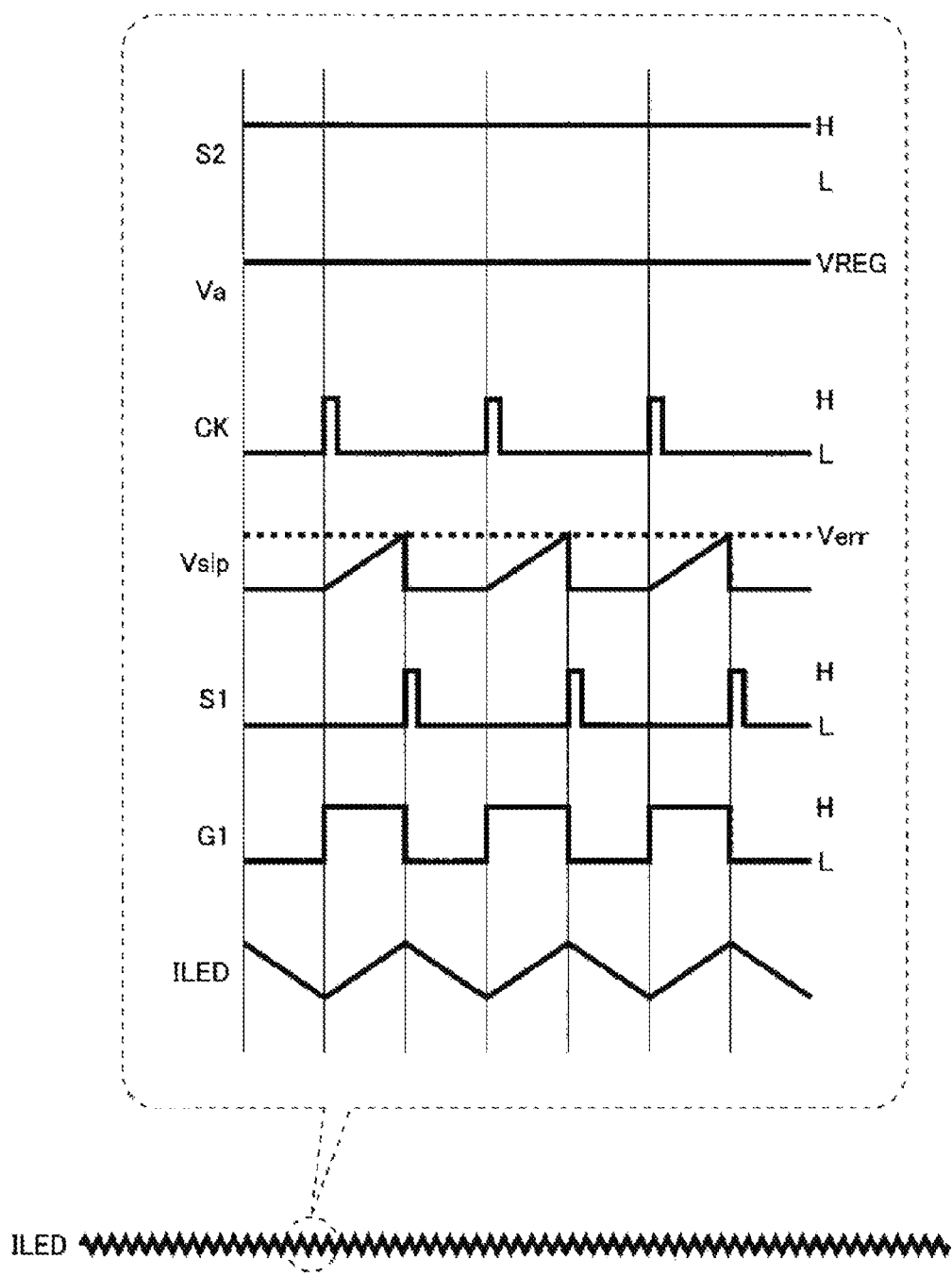
FIG. 8 is a timing chart showing a first behavior (DC drive/SS Off) of ILED.

FIG. 8 is a timing chart showing a first behavior (DC drive/Frequency Spreading Off) an output current ILED. The output current ILED is depicted outside an extended frame of a broken line. A PWM dimming signal S2, a ramp voltage Va, a clock signal CK, a slope voltage Vslp, a comparison signal S1, a gate signal G1 and an output current ILED are depicted inside extended frame of the broken line.

In DC drive (S2: H fixed) and frequency spreading Off (Va: VREF fixed), the oscillation frequency Fsoc of the clock signal CK is constant. Accordingly, a duty ratio of the gate signal G1 is constant and further a current value of the output current ILED is also constant. A frequency of a ripple component superimposing on the output current ILED is several hundred kHz (for example, 300 kHz), like the oscillation frequency Fsoc of the clock signal CK. Therefore, a flicker of the light emitting diode array Z1 is less likely to be visually recognized by naked eyes.

Figure 9:
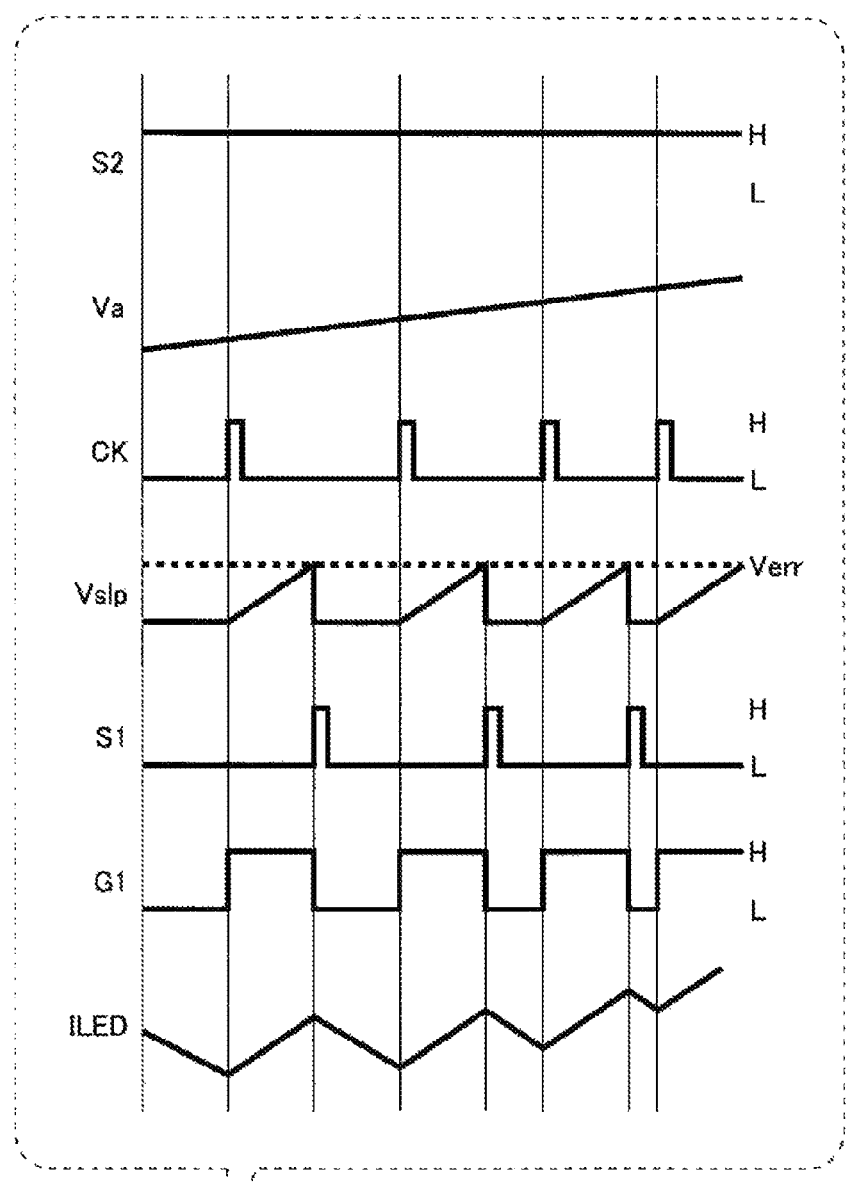
FIG. 9 is a timing chart showing a second behavior (DC drive/SS On) of ILED.

FIG. 9 is a timing chart showing a second behavior (DC drive/Frequency Spreading On) of the output current ILED. The output current ILED is depicted outside an extended frame of a broken line. The PWM dimming signal S2, the ramp voltage Va, the clock signal CK, the slope voltage Vslp, the comparison signal S1, the gate signal G1 and the output current ILED are depicted inside the extended frame of the broken line.

In DC drive (S2: H fixed) and frequency spreading On (Va: varied), the oscillation frequency Fsoc of the clock signal CK is varied periodically in conjunction with a charging/discharging operation of the ramp voltage Va. As a result, a duty ratio of the gate signal G1 is varied periodically and further a current value of the output current ILED is also varied periodically. A first ripple component having a frequency (corresponding to Fosc) of several hundred kHz and a second ripple component having a frequency (corresponding to Framp) of several hundred Hz are superimposed on the output current ILED. However, since the second ripple component is continuously superimposed on the output current ILED, a flicker of the light emitting diode array Z1 is less likely to be visually recognized by naked eyes.

Figure 10:
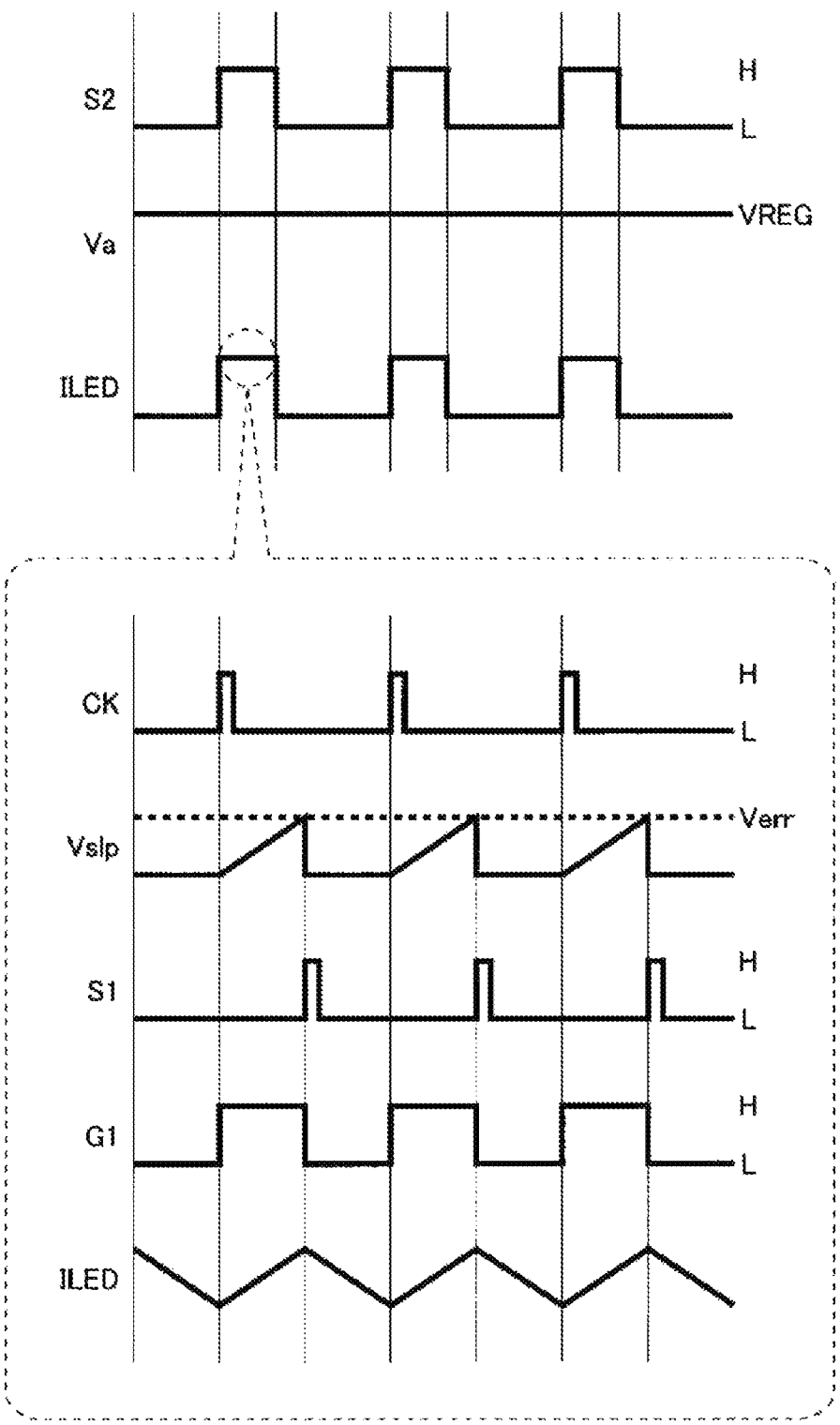
FIG. 10 is a timing chart showing a third behavior (PWM drive/SS Off) of ILED.

FIG. 10 is a timing chart showing a third behavior (PWM drive/Frequency Spreading Off) the output current ILED. The PWM dimming signal S2, the ramp voltage Va and the output current ILED are depicted outside an extended frame of a broken line. The clock signal CK, the slope voltage Vslp, the comparison signal S1, the gate signal G1 and the output current ILED are depicted inside the extended frame of the broken line.

In PWM drive (S2: pulse drive) and frequency spreading Off (Va: VREF fixed), an operation of supply of the output current ILED to the light emitting diode array Z1 is intermittently turned on/off at a predetermined frequency (for example, 100 to 200 Hz) according to pulse drive of the PWM dimming signal S2. However, when frequency spreading of the clock signal CK is in an off state, the current value of the output current ILED is always constant at any period. Accordingly, a flicker of the light emitting diode array Z1 is less likely to be visually recognized by naked eyes.

Figure 11:
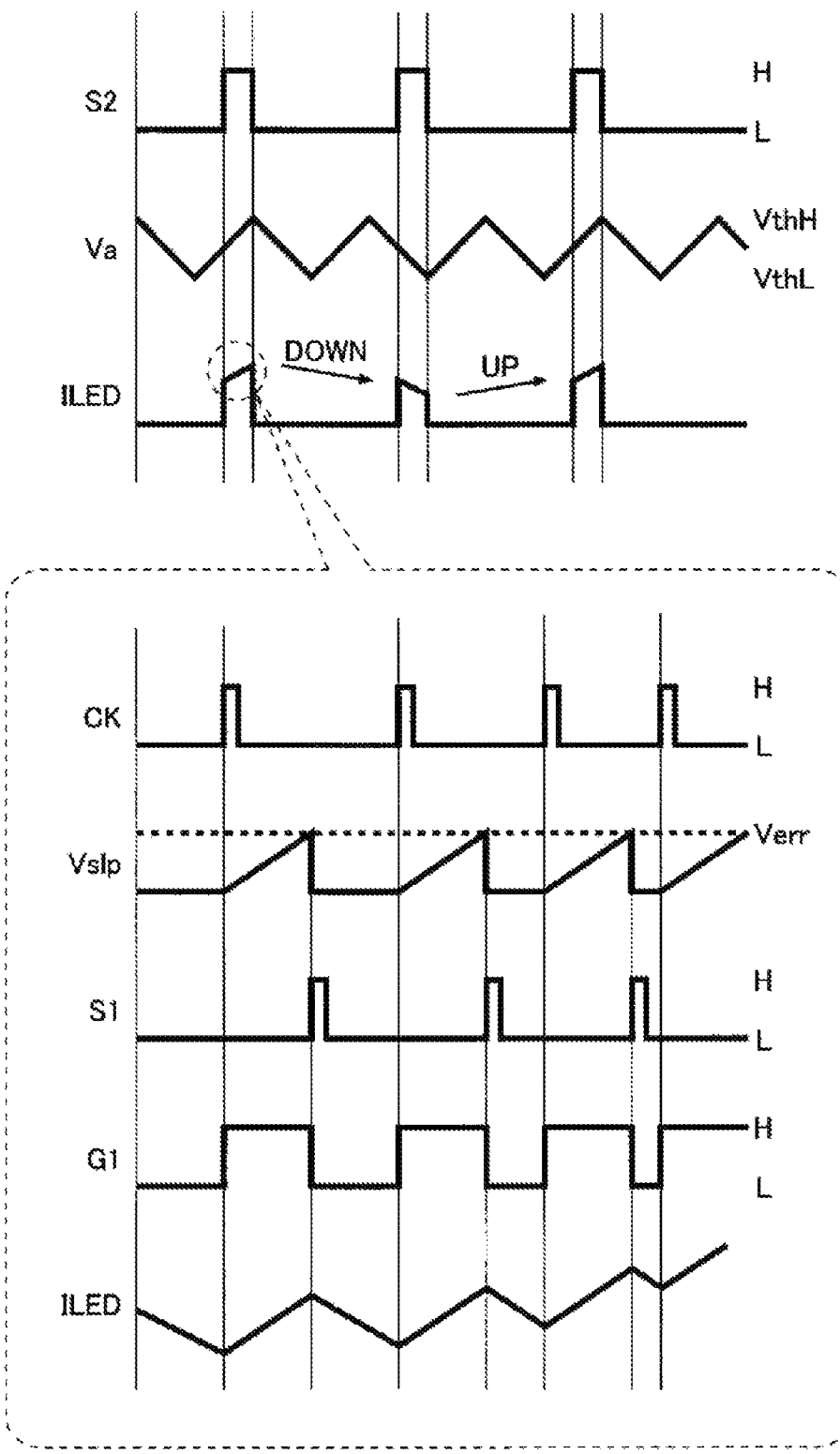
FIG. 11 is a timing chart showing a fourth behavior (PWM drive/SS On) of ILED.

FIG. 11 is a timing chart showing a fourth behavior (PWM drive/Frequency Spreading On) of the output current ILED. The PWM dimming signal S2, the ramp voltage Va and the output current ILED are depicted outside an extended frame of a broken line. The clock signal CK, the slope voltage Vslp, the comparison signal S1, the gate signal G1 and the output current ILED are depicted inside the extended frame of the broken line.

In PWM drive (S2: pulse drive) and frequency spreading On (Va: varied), the operation of supply of the output current ILED to the light emitting diode array Z1 is intermittently turned on/off at a predetermined frequency (for example, 100 to 200 Hz) according to the pulse drive of the PWM dimming signal S2, as described previously. Here, when the frequency spreading of the clock signal CK is in an on state, the current value of the output current ILED is greatly varied for each period. Accordingly, there is a concern that a flicker of the light emitting diode array Z1 is more likely to be visually recognized by naked eyes. Such a flicker is caused by which the PWM dimming signal S2 and the ramp voltage Va are asynchronous with each other.

<Fourth Configuration Example of Oscillation Circuit>

Figure 12:
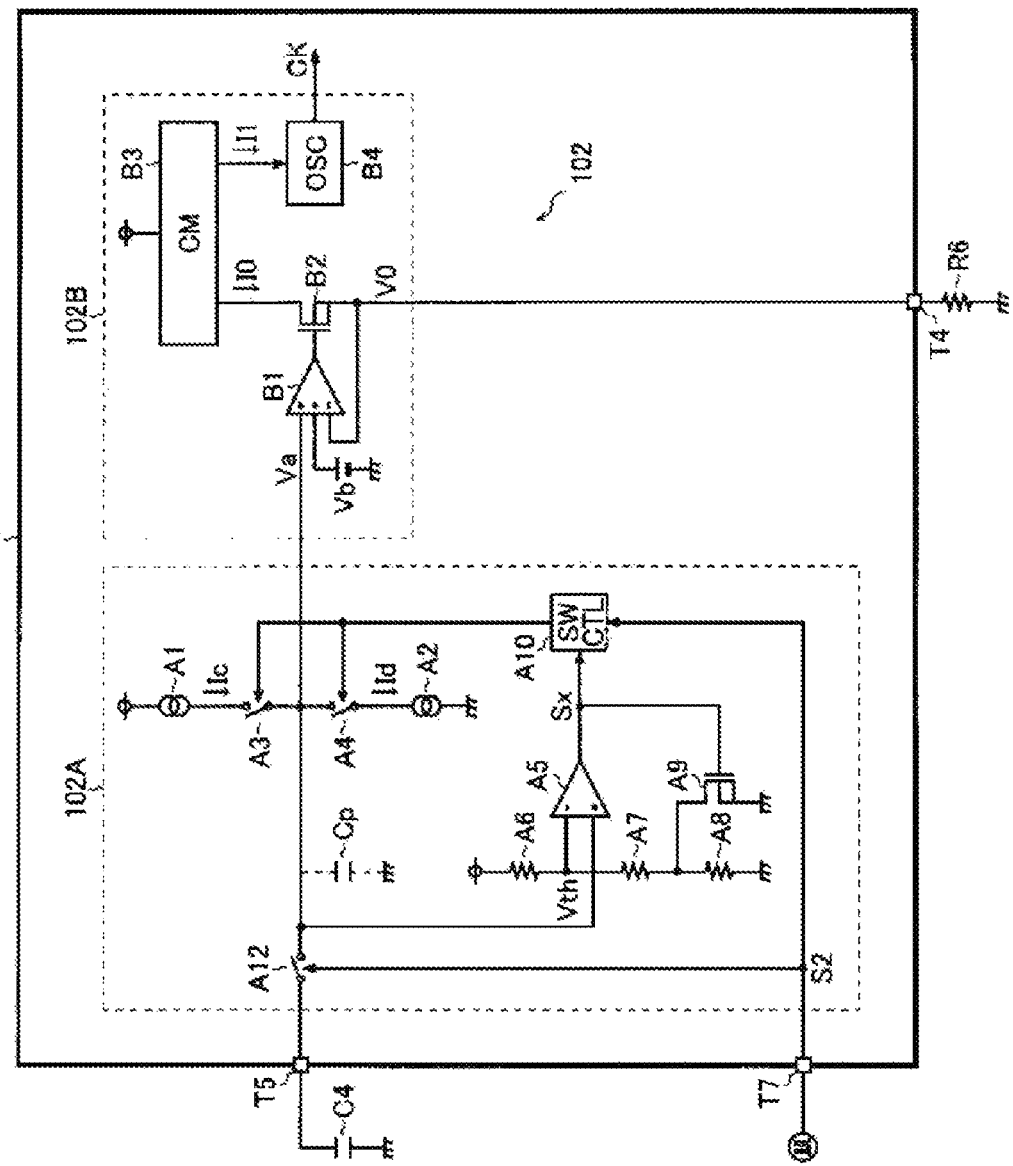
FIG. 12 is a circuit diagram showing a fourth configuration example of the oscillation circuit.

FIG. 12 is a circuit diagram showing an oscillation circuit 102 of a fourth configuration example. The oscillation circuit 102 of the fourth configuration example has basically the same configuration as that of the first configuration example except that a frequency spreading control of the clock signal CK is performed in synchronization with the PWM dimming signal S2 (corresponding to an output operation control signal for periodically turning on/off an output operation of the switching power supply circuit). Therefore, the same elements as the first configuration example are denoted by the same reference numerals as FIG. 2, an explanation of which will not be repeated. The following description will be focused on characteristic portions of the fourth configuration example.

In the oscillation circuit 102 of the fourth configuration example, a ramp voltage generating part 102A further includes a switch A12 in addition to the above-mentioned elements A1 to A10.

The switch A12 is connected between the external terminal T5 (the RS pin to which the first terminal of the capacitor C4 is connected) and an output terminal of the ramp voltage Va, and is switched on/off in response to the PWM dimming signal S2. More specifically, the switch A12 is switched on when the PWM dimming signal S2 has a high level, and is switched off when the PWM dimming signal S2 has a low level.

When the switch A12 is switched on, the charging voltage of the capacitor C4 is output as the ramp voltage Va. On the other hand, when the switch A12 is switched off, the ramp voltage Va, which is output immediately before the switch A12 is switched off, is held. Parasitic capacitance Cp accompanied by wirings of a semiconductor device 100 may be used for a means for holding the ramp voltage Va.

In the oscillation circuit 102 of the fourth configuration example, the charging/discharging control part A10 receives the PWM dimming signal S2 in addition to the comparison signal Sx and performs the charging/discharging control of the capacitor C4. More particularly, the charging/discharging control part A10 brings one of the current sources A1 and A2 into an operation state by switching on one of the switches A3 and A4 in response to the comparison signal Sx when the PWM dimming signal S2 has the high level, and brings both of the current sources A1 and A2 into a stop state by switching off both of the switches A3 and A4, independent of the comparison signal Sx, when the PWM dimming signal S2 has the low level. Further, the operations of generating the charging current Ic and the discharging current Id may be turned on/off by themselves to thereby omit the switches A3 and A4.

According to the above-described series of operations, the ramp voltage generating part 102A samples/holds the ramp voltage Va in synchronization with the PWM dimming signal S2. With such a sample/hold operation, the ramp voltage Va is not necessarily a voltage signal having a ramp waveform. Therefore, in the following description, so as not to incur unnecessary doubt, the ramp voltage Va is read as a variable voltage Va and the ramp voltage generating part 102A is read as a variable voltage generating part 102A.

Figure 13:
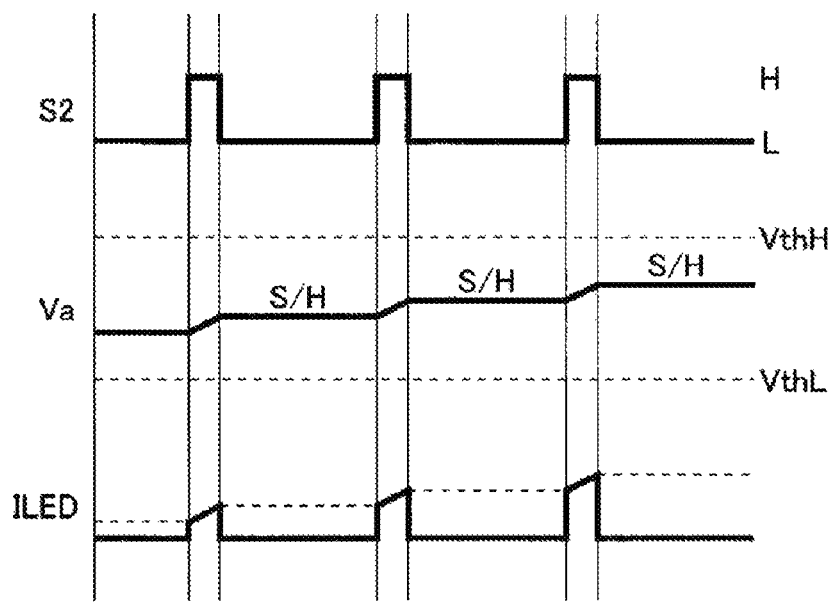
FIG. 13 is a timing chart showing a behavior of ILED in the fourth configuration example.

FIG. 13 is a timing chart showing a behavior of an output current ILED in the fourth configuration example, showing the PWM dimming signal S2, the variable voltage Va and output current ILED from top to bottom.

In PWM drive (S2: pulse drive) and the frequency spreading On (Va: varied), the operation of supply of the output current ILED to the light emitting diode array Z1 with the pulse drive of the PWM dimming signal S2 is intermittently turned on/off at a predetermined frequency (for example, 100 to 200 Hz), as described previously.

However, in the oscillation circuit 102 of the fourth configuration example, since the variable voltage Va is sampled/held in a period during which the PWM dimming signal S2 has the low level, the current value of the output current ILED is not greatly varied for each period. Accordingly, it is possible to reduce a flicker of the light emitting diode array Z1.

Incidentally, although the fourth configuration example has been based on the first configuration example (FIG. 2) and has been illustrated with the configuration of performing the frequency spreading control of the clock signal CK in synchronization with the PWM dimming signal S2, the fourth configuration example may be based on the second configuration example (FIG. 5) or the third configuration example (FIG. 7).

<Fifth Configuration Example of Oscillation Circuit>

Figure 14:
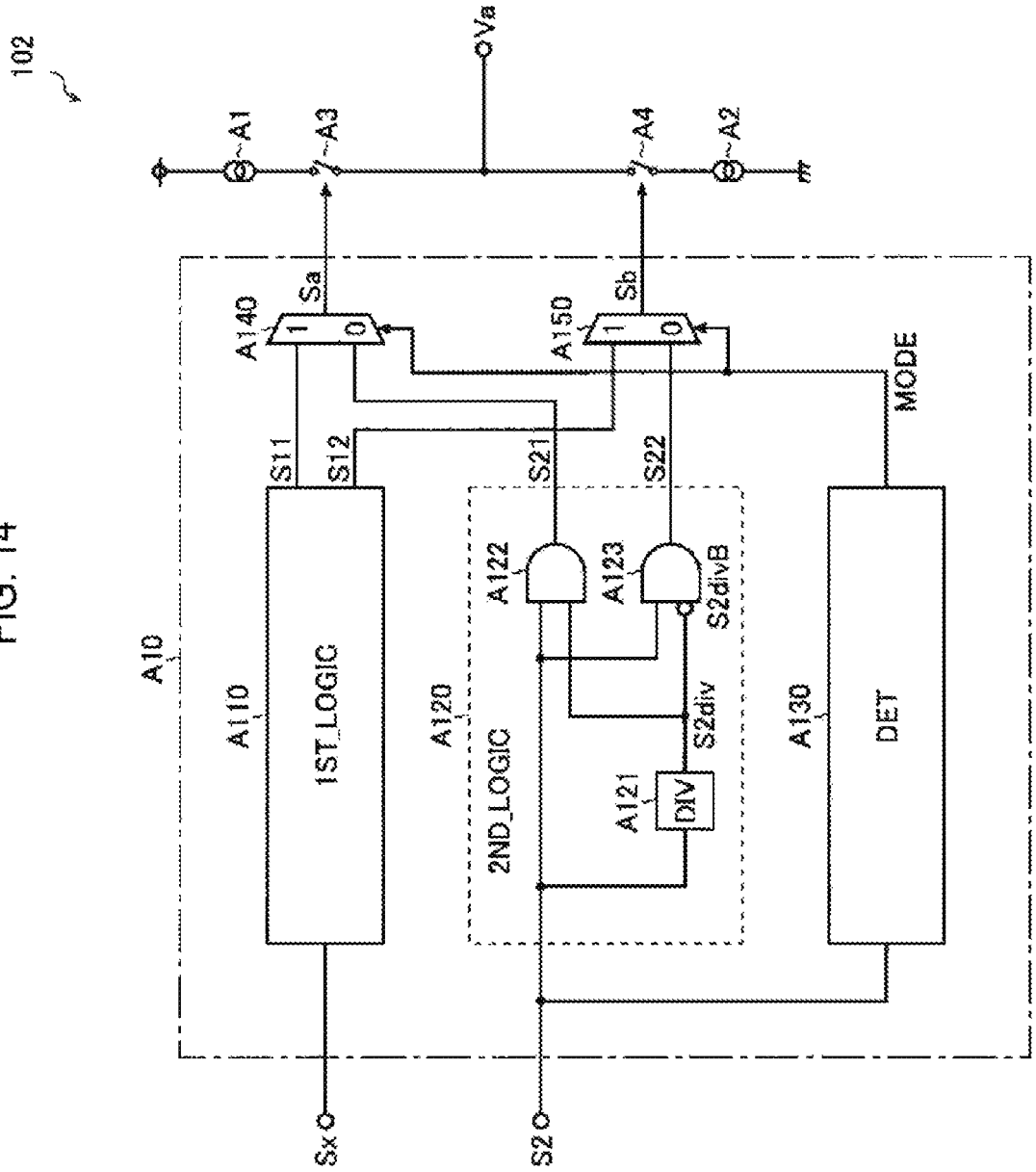
FIG. 14 is a circuit diagram showing a fifth configuration example of the oscillation circuit.

FIG. 14 is a circuit diagram showing an oscillation circuit 102_5 of a fifth configuration example. The oscillation circuit 102_5 of the fifth configuration example has basically the same configuration as that of the fourth configuration example except that the charging/discharging control part A10 of the former is different in its internal configuration from that of the latter. Therefore, the same elements as the fourth configuration example are denoted by the same reference numerals as FIG. 12, an explanation of which will not be repeated. The following description will be focused on characteristic portions of the fifth configuration example.

In the oscillation circuit 102 of the fifth configuration example, the charging/discharging control part A10 includes a first logic part A110, a second logic part A120, a detector A130 and selectors A140 and A150.

The first logic part A110 generates a first charging signal S11 and a first discharging signal S12 so as to bring one of the current sources A1 and A2 into an operation state in response to the comparison signal Sx. More specifically, the first charging signal S11 has a high level in a period during which the comparison signal Sx has a low level, and has a low level in a period during which the comparison signal Sx has a high level. On the other hand, the first discharging signal S12 has a low level in the period during which the comparison signal Sx has the low level, and has a high level in the period during which the comparison signal Sx has the high level. When the first logic part A110 is selected (Sa=S11 and Sb=S12), the switches A3 and A4 are switched on/off in response to the first charging signal S11 and the first discharging signal S12.

The second logic part A120 includes a frequency divider A121 and AND gates A122 and A123, and generates a second charging signal S21 and a second discharging signal S22 so as to bring one of the current sources A1 and A2 into an operation state alternately in synchronization with the PWM dimming signal S2. When the second logic part A120 is selected (Sa=S21 and Sb=S22), the switches A3 and A4 are switched on/off in response to the second charging signal S21 and the second discharging signal S22.

The frequency divider A121 generates a frequency division signal S2div by dividing the frequency of the PWM dimming signal S1 by ½. That is, a logic level of the frequency division signal S2div is changed in synchronization with a rising edge of the PWM dimming signal S2.

The AND gate A122 generates the second charging signal S21 through an AND operation of the PWM dimming signal S2 and the frequency division signal S2div. The second charging signal S21 has a low level when at least one of the PWM dimming signal S2 and the frequency division signal S2div has a low level, and has a high level when both of the PWM dimming signal S2 and the frequency division signal S2div have a high level.

The AND gate A123 generates the second discharging signal S22 through an AND operation of the PWM dimming signal S2 and an inverted frequency division signal S2divB (a signal obtained by logically inverting the frequency division signal S2div). The second discharging signal S22 has a low level when at least one of the PWM dimming signal S2 and the inverted frequency division signal S2divB has a low level, and has a high level when both of the PWM dimming signal S2 and the inverted frequency division signal S2divB have a high level.

Figure 15:
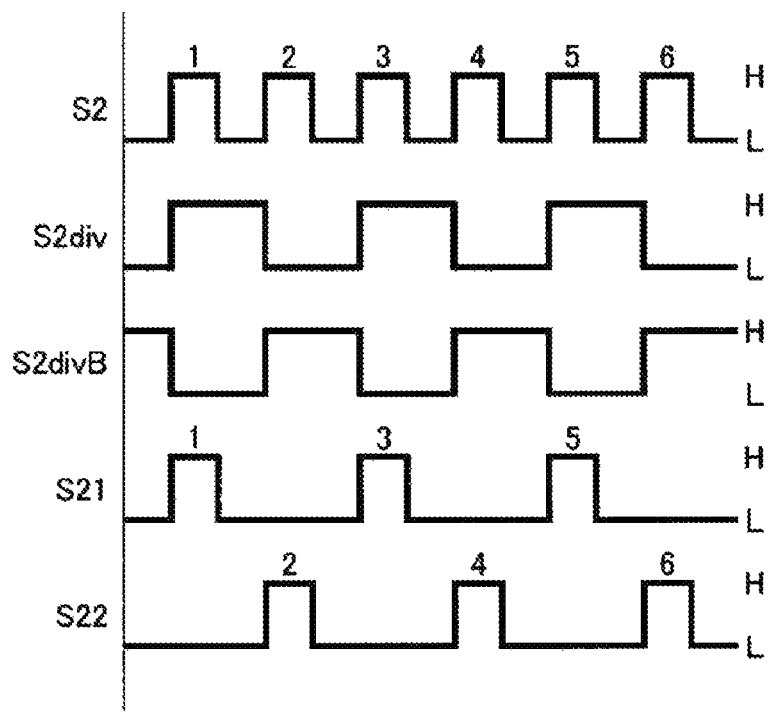
FIG. 15 is a timing chart showing a control signal generating operation of a second logic part.

FIG. 15 is a timing chart showing a control signal generating operation of the second logic part 120, showing the PWM dimming signal S2, the frequency division signal S2div, the inverted frequency division signal S2divB, the second charging signal S21 and the second discharging signal S22 from top to bottom. In the example of this figure, odd-numbered pulses of the PWM dimming signal S2 appear in the second charging signal S21 and even-numbered pulses of the PWM dimming signal S2 appear in the second discharging signal S22.

Returning to FIG. 14, the descriptions for the internal configuration of the charging/discharging control part A10 will be described.

The detector A130 generates an operation mode signal MODE by detecting whether or not the PWM dimming signal S2 is pulse-driven to control the selectors A140 and A150. The operation mode signal MODE has a high level when the PWM dimming signal S2 is not pulse-driven, and has a low level when the PWM dimming signal S2 is pulse-driven.

The selector A140 selects one of the first charging signal S11 and the second charging signal S21 in response to the operation mode signal MODE and outputs the selected one, as a charging signal Sa, to the switch A3. More specifically, the selector A140 selects the first charging signal S11 as the charging signal Sa when the operation mode signal MODE has the high level, and selects the second charging signal S21 as the charging signal Sa when the operation mode signal MODE has the low level. The switch A3 is switched on when the charging signal Sa has a high level, and is switched off when the charging signal Sa has a low level.

The selector A150 selects one of the first discharging signal S12 and the second discharging signal S22 in response to the operation mode signal MODE and outputs the selected one, as a discharging signal Sb, to the switch A4. More specifically, the selector A150 selects the first discharging signal S12 as the discharging signal Sb when the operation mode signal MODE has the high level, and selects the second discharging signal S22 as the discharging signal Sb when the operation mode signal MODE has the low level. The switch A4 is switched on when the discharging signal Sb has a high level, and is switched off when the discharging signal Sb has a low level.

That is, with the charging/discharging control part A10 of the fifth configuration example, it is possible to bring one of the current sources A1 and A2 into an operation state in response to the comparison signal Sx when the PWM dimming signal S2 is not pulse-driven and bring one of the current sources A1 and A2 into an operation state alternately for each period during which the PWM dimming signal S2 has the high level, independent of the comparison signal Sx, when the PWM dimming signal S2 is pulse-driven.

Figure 16:
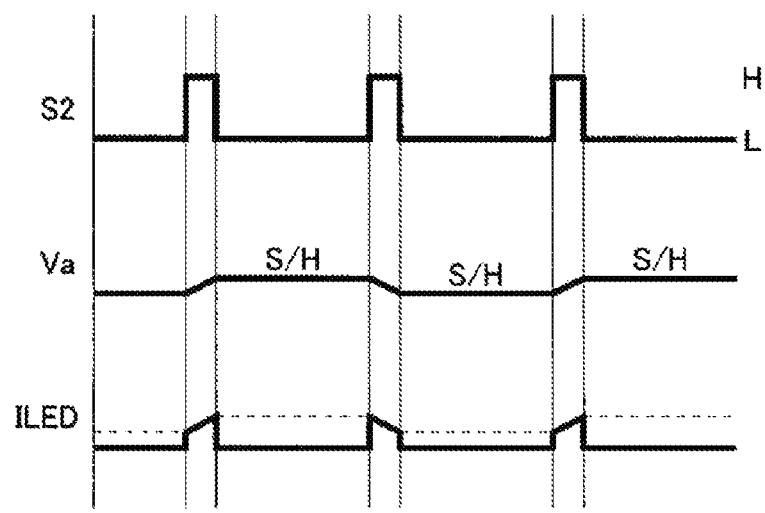
FIG. 16 is a timing chart showing a behavior of ILED in the fifth configuration example.

FIG. 16 is a timing chart showing a behavior of an output current ILED in the fifth configuration example, showing the PWM dimming signal S2, the variable voltage Va and output current ILED from top to bottom.

When the PWM is driven (S2: pulse drive) and the frequency spreading is turned On (Va: variable), the operation of supply of the output current ILED to the light emitting diode array Z1 with the pulse drive of the PWM dimming signal S2 is intermittently turned on/off at a predetermined frequency (for example, 100 to 200 Hz), as described previously.

However, in the oscillation circuit 102 of the fifth configuration example, like the above-described fourth configuration example, since the variable voltage Va is sampled/held in a period during which the PWM dimming signal S2 has the low level, the current value of the output current ILED is not greatly varied for each period.

In addition, in the oscillation circuit 102 of the fifth configuration example, the charging operation and the discharging operation of the variable voltage Va are switched alternately each time the PWM dimming signal S2 has the high level. Accordingly, since a variation width of the output current ILED can be suppressed to be smaller than that in the fourth configuration example, it is possible to further reduce a flicker of the light emitting diode array Z1.

However, in the oscillation circuit 102 of the fifth configuration example, since the frequency spreading of the clock signal CK is not performed in a full range, the noise reduction effect is insufficient as compared to that in the fourth configuration example. Accordingly, in consideration of a priority of the noise reduction and flicker reduction, it is desirable that the oscillation circuit 102 determines whether to employ the fourth configuration example or the fifth configuration example.

<Vehicle and LED Ramp Module>

Figure 17A:
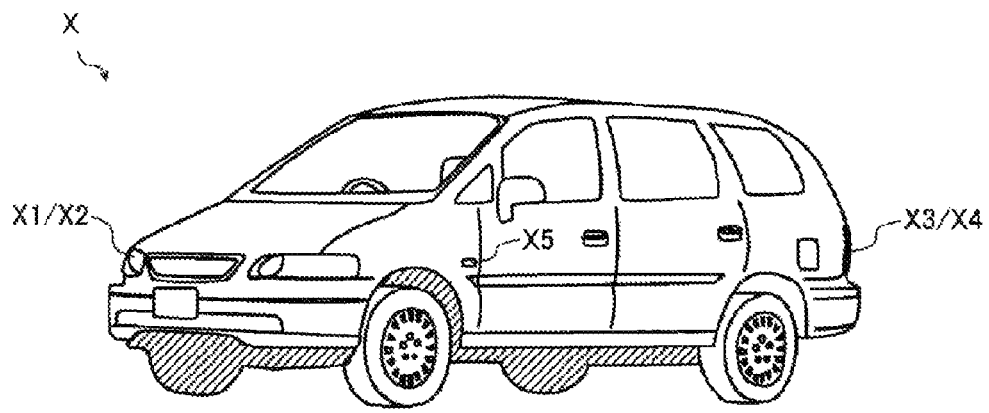
FIG. 17A is an external appearance of a vehicle equipped with a vehicle LED drive IC (when viewed from the front).
Figure 17B:
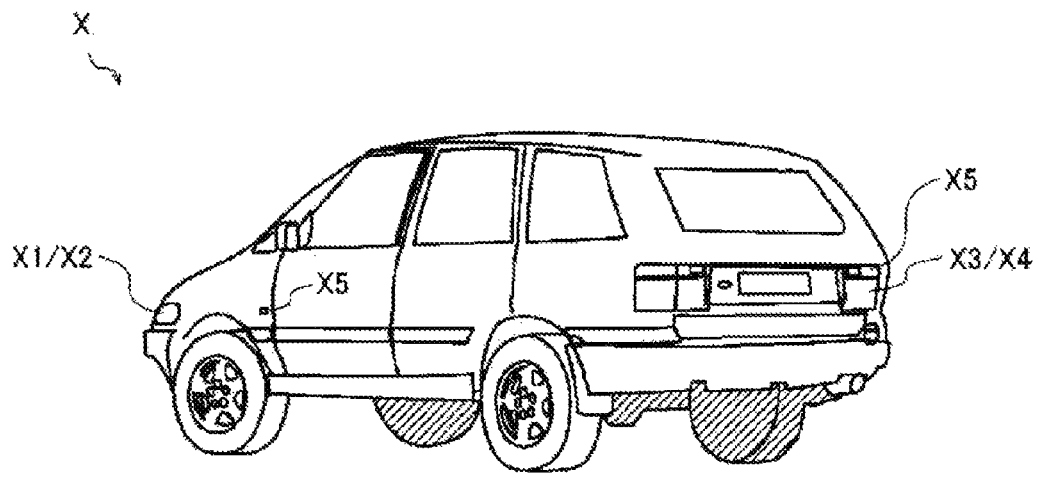
FIG. 17B is a view showing an external appearance of the vehicle equipped with the vehicle LED drive IC (when viewed from the rear).
Figure 18A:
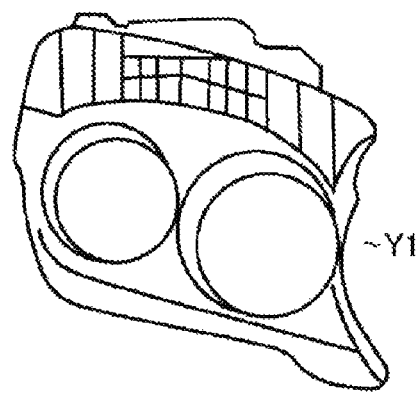
FIG. 18A is a view showing an external appearance of an LED headlight module.
Figure 18B:
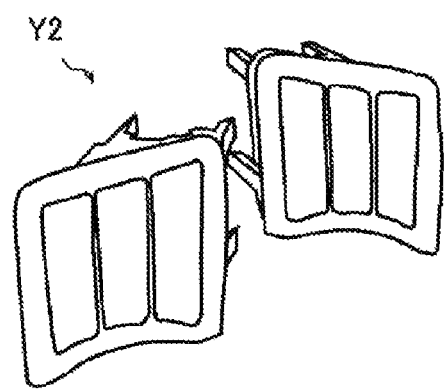
FIG. 18B is a view showing an external appearance of an LED turn lamp module.
Figure 18C:
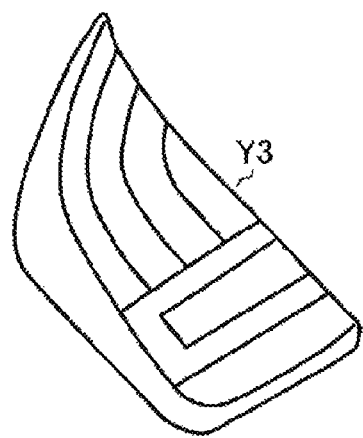
FIG. 18C is a view showing an external appearance of an LED rear lamp module.

The IC 100 may be suitably used as driving means for a headlight (appropriately including high beam/low beam/small lamp/fog lamp, etc.) X1, a light source X2 for daytime running lamp (DRL), a tail lamp (appropriately including a small lamp, back lamp, etc.) X3, a stop lamp X4, a turn lamp X5, etc. of a vehicle X, as shown in FIGS. 17A and 17B. In addition, the IC 100 may be provided as an LED lamp module (an LED headlight module Y1 shown in FIG. 18A, an LED turn lamp module Y2 shown in FIG. 18B, an LED rear lamp module Y3 shown in FIG. 18C, etc.) along with an LED to be driven or may be provided as a single IC independent of the LED.

In addition, the IC 100 may be suitably used for applications (head-up displays (HUDs) and so on) requiring a high brightness LED light source, in addition to the vehicle exterior lightings.

<Other Modifications>

In addition to the above embodiments, the present disclosure can be modified in various ways without departing from the spirit and scope of the disclosure. For example, although it has been described that the embodiments of the present disclosure are applied to the vehicle LED driver IC, the embodiments may not be limited thereto but may be applied to a general oscillation circuit having a frequency spreading function.

The present disclosure can be used in, for example, oscillation circuits of vehicle LED driver ICs.

According to the present disclosure in some embodiments, it is possible to provide an oscillation circuit which is capable of suppressing an output variation due to frequency spread of clock signal even when an output operation of a switching power supply is periodically turned on/off.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An oscillation circuit for generating a clock signal of a switching power supply circuit, comprising:
a circuit configured to perform frequency spreading control of the clock signal in synchronization with an output operation control signal for periodically turning on/off an output operation of the switching power supply circuit,
wherein the circuit comprises:
a variable voltage generating part configured to generate a variable voltage in synchronization with the output operation control signal; and
a clock signal generating part configured to determine an oscillation frequency of the clock signal based on the variable voltage.

2. The oscillation circuit of claim 1, wherein the variable voltage generating part samples/holds the variable voltage in synchronization with the output operation control signal.

3. The oscillation circuit of claim 2, wherein the variable voltage generating part includes: a first current source configured to generate a charging current of a capacitor; a second current source configured to generate a discharging current of the capacitor; a hysteresis comparator configured to generate a comparison signal by comparing a charging voltage appearing on a first terminal of the capacitor with a threshold voltage; a charging/discharging control part configured to control charging/discharging of the capacitor in response to the comparison signal and the output operation control signal; and a switch which is connected between the first terminal of the capacitor and an output terminal of the variable voltage and is configured to be switched on/off in response to the output operation control signal.

4. The oscillation circuit of claim 3, wherein the charging/discharging control part brings one of the first current source and the second current source into an operation state in response to the comparison signal when the output operation of the switching power supply circuit is turned on, and brings both of the first current source and the second current source into a stop state, independent of the comparison signal, when the output operation of the switching power supply circuit is turned off.

5. The oscillation circuit of claim 3, wherein the charging/discharging control part brings one of the first current source and the second current source into an operation state in response to the comparison signal when the output operation control signal is not pulse-driven, and brings one of the first current source and the second current source into a stop state alternately each time the output operation of the switching power supply circuit is turned on, independent of the comparison signal, when the output operation control signal is pulse-driven.

6. The oscillation circuit of claim 5, wherein the charging/discharging control part includes: a first logic part configured to bring one of the first current source and the second current source into an operation state in response to the comparison signal; a second logic part configured to bring one of the first current source and the second current source into an operation state alternately in synchronization with the output operation control signal; and a selector configured to select one of the first logic part and the second logic part.

7. The oscillation circuit of claim 6, further comprising a detector configured to detect whether or not the output operation control signal is pulse-driven, and control the selector based on a result of the detection.

8. A semiconductor device comprising: the oscillation circuit of claim 1, configured to generate the clock signal; and the switching power supply circuity configured to be operated based on the clock signal.

9. A lighting device comprising: the semiconductor device of claim 8; and a light source configured to emit light by receiving power supplied from the semiconductor device.

* * * * *